(12) United States Patent
Strang et al.

(10) Patent No.: US 6,960,887 B2
(45) Date of Patent: Nov. 1, 2005

(54) METHOD AND APPARATUS FOR TUNING A PLASMA REACTOR CHAMBER

(75) Inventors: Eric J. Strang, Chandler, AZ (US); Wayne L. Johnson, Phoenix, AZ (US); Robert G. Hostetler, Maricopa, AZ (US); Steven T. Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 201 days.

(21) Appl. No.: 10/359,556

(22) Filed: Feb. 7, 2003

(65) Prior Publication Data
US 2003/0227258 A1 Dec. 11, 2003

Related U.S. Application Data

(63) Continuation of application No. PCT/US01/24570, filed on Aug. 7, 2001.
(60) Provisional application No. 60/224,217, filed on Aug. 10, 2000.

(51) Int. Cl.[7] ............................ H01J 7/24; H05B 31/26; H01L 21/302
(52) U.S. Cl. .................. 315/111.21; 438/710; 438/714
(58) Field of Search ........................ 315/111.21, 111.31, 315/111.61; 438/714, 729, 710, 731, 726, 733; 156/345; 216/71; 118/723 E

(56) References Cited

U.S. PATENT DOCUMENTS

| | | | |
|---|---|---|---|
| 4,209,357 A | 6/1980 | Gorin et al. | |
| 4,352,974 A | 10/1982 | Mizutani et al. | ......... 219/121.4 |
| 4,367,114 A | 1/1983 | Steinberg et al. | ...... 156/345.34 |
| 4,389,307 A * | 6/1983 | Boadway | .................... 209/728 |
| 5,009,738 A | 4/1991 | Gruenwald et al. | ..... 156/345.47 |
| 5,441,568 A | 8/1995 | Cho et al. | ................... 118/715 |
| 5,856,240 A | 1/1999 | Sinha et al. | ................. 438/758 |
| 6,070,552 A | 6/2000 | Mizuno et al. | .......... 118/723 E |
| 6,221,782 B1 * | 4/2001 | Shan et al. | ................. 438/710 |
| 6,325,916 B1 * | 12/2001 | Lambert et al. | ............ 205/751 |
| 2002/0160125 A1 * | 10/2002 | Johnson et al. | ............. 427/569 |

FOREIGN PATENT DOCUMENTS

| | | |
|---|---|---|
| EP | 0 758 688 | 2/1997 |
| WO | WO 00/03059 | 1/2000 |

* cited by examiner

*Primary Examiner*—Wilson Lee
*Assistant Examiner*—Chuc Tran
(74) *Attorney, Agent, or Firm*—Pillsbury Winthrop LLP

(57) ABSTRACT

A plasma reactor or vacuum processing apparatus is provided with an orifice plate assembly. The orifice plate assembly includes an upper plate and a lower plate. Each plate is configured with through holes. The upper and lower orifice plates are independently rotatable with respect to each other. The plates are arranged within the vacuum chamber a discharge reactor such that the chuck assembly is disposed within an opening in the orifice plate assembly. The orifice plate assembly is further configured to have a perimeter shape that substantially matches the interior wall shape of vacuum chamber.

47 Claims, 7 Drawing Sheets

METHOD AND APPARATUS FOR TUNING A PLASMA REACTOR CHAMBER

This is a Continuation of International Application No. PCT/US01/24570, which was filed on Aug. 7, 2001 and claims U.S. Provisional Application No. 60/224,217, which was filed Aug. 10, 2000, the contents of which are incorporated herein by reference.

BACKGROUND OF THE INVENTION

The present invention relates to the field of plasma processing of semiconductor wafers and more particularly to plasma processing equipment having improved and tunable chamber vacuum characteristics.

As is known in the art, a fundamental step in the manufacture of semiconductor devices, such as integrated circuits (ICs), is the process of forming electrical interconnections. The formation of electrical circuits, such as semiconductor transistors, involves a series of steps starting with the formation of a blank silicon wafer. The blank silicon wafer is then processed using successive steps of depositing to and etching away various materials to form the proper interconnections and therefore the electrical circuits.

One method of depositing and etching metal layers to and from a silicon wafer includes the use of a so-called plasma reactor system. In semiconductor manufacturing, plasma reactor systems are used to remove material from or deposit material to a workpiece (e.g., semiconductor wafer) in the process of making integrated circuit (IC) devices. A key factor in obtaining the highest yield and overall quality of ICs is the uniformity of the etching and deposition processes.

In a narrow gap, high aspect ratio capacitively coupled plasma reactor, a chuck design is often employed that attempts to allow the chuck (i.e. wafer work piece holder) to serve additional purposes other than supporting the wafer. The complexity of the mechanical design of the chuck is such that a non-optimal vacuum system design is required. A vacuum pumping system is used to evacuate the reactor processing region to the low pressures necessary to create a clean environment, to which a specific gas chemistry is introduced, which provides an environment for the generation of plasma. Consequently, due to the complexity of the chuck mechanical design, the symmetry of the vacuum system (relative to the wafer) is sacrificed such that the vacuum pump is usually positioned to access the reactor vacuum chamber from the side rather than from the chamber bottom or top.

This type of multi-purpose chuck can become a very cumbersome component of the reactor. In a multi-purpose chuck design, in addition to supporting the wafer, the chuck is typically configured to provide vertical translation in order to reduce the electrode-to-wafer spacing. This spacing control is necessary in order to produce a narrow gap for process conditions and to enlarge the gap for wafer exchange. In addition to the aforementioned capabilities, the chuck must be capable of sustaining a radio frequency (RF) energy bias. Moreover, the chuck design further includes components for chuck cooling, electrostatic clamping and backside gas flow to improve thermal conduction (between the wafer and the chuck). Consequently, the vacuum design is often a secondary consideration to other various mechanical and electrical component designs.

A reactor chamber that is equipped with a side mount vacuum port is considered an "asymmetrical design" in a nominally cylindrical system. An inherent drawback associated with an asymmetric design is that it often times produces an asymmetric process. One such asymmetry stemming from an asymmetric vacuum design is the observation of pressure field non-uniformity above the wafer when the chamber is evacuated from the side. That is, a pressure gradient with about 10–20% variation can occur across the wafer being processed. In general, for moderate to high pressures (e.g. P>20 mTorr), a region of low pressure is observed at an azimuthal location adjacent the pump entrance or pumping duct entrance (the pumping duct interfaces the inlet of the pump, e.g. turbo-molecular pump, with the vacuum chamber). In prior art capacitively coupled plasma reactors, attempts to solve the problem of an asymmetric chamber flow field introduced by pumping from the side have included the insertion of an orifice plate adjacent to the chuck.

A processing chamber generally includes a single evacuated volume wherein a portion of that volume is proximate the wafer and is hereinafter referred to as the processing region. When an orifice plate is employed, the chamber volume is separated into two regions by the orifice plate. The first region is predominantly occupied by the wafer processing region and the second region, referred to as the pumping volume, is accessed by the vacuum pump. This solution tends to improve the flowfield uniformity in the upper chamber volume by providing sufficient flow resistance through the orifice plate. However, as will be discussed later, this improvement is achieved at the expense of flow conductance or pumping speed at the processing region. In addition to placing the orifice plate adjacent the chuck, other prior art designs included locating the orifice plate adjacent other surfaces, e.g. any surface interfacing the processing chamber volume that allows the exhaust of chamber gases. For example, U.S. Pat. No. 4,209,357 to Gorin et al. discloses injection orifices that are integrated with the exhaust orifices upon the upper electrode. The "small" exhaust orifices serve the same purpose for providing flow resistance (or reduced flow conductance). Other prior art chambers include a design consisting of a narrow annular orifice surrounding the chuck or wafer where the narrow annular gap separates the processing region from the pumping region (see U.S. Pat. No. 4,352,974 to Mizutani et al., U.S. Pat. No. 4,367,114 to Steinberg et al., U.S. Pat. No. 5,441,568 to Cho et al., and U.S. Pat. No. 5,856,240 to Sinha et al.

There are several inherent problems with the methods employed in the prior art to use an orifice to control pressure uniformity in a chamber. For example, prior art orifice plates typically distribute the small openings equally in the azimuthal direction about the orifice plate in the hope that the resultant flow conductance will be azimuthally symmetric through the plate. However, in order to achieve flowfield uniformity, it is necessary to restrict the flow through the orifice plate to the extent that the pressure difference across the orifice is significantly greater than any pressure gradient in the processing or pumping regions. This requires making the holes in the orifice plate small and, hence, paying a penalty in chamber pumping speed at the wafer. This penalty in pumping speed directly results in an adverse effect on throughput. Additionally, the methods of flow restriction in the prior art are not adjustable, that is they are fixed in space for one set of conditions. The fact that they are fixed requires the system to be modeled for a particular orifice plate or tested, one orifice plate after another, to determine the optimal geometry.

In addition to the problem of pressure field non-uniformity described above, an additional problem associated with plasma processing systems is the transport of plasma to the pumping duct and pump inlet. In general, the aforementioned orifice plate or a separate pumping duct screen is utilized to attenuate the plasma density prior to reaching the pump inlet. For example, in typical prior art systems a pump screen (with generally less than 50% solidity) is placed in the cross-section of the pumping duct. Unfortunately the pumping screen attenuates the plasma and also reduces the pumping speed delivered to the processing region by at least a factor of two. This approach results in at least 50% of the frontal area of the pumping duct cross-section being utilized for recombination surfaces. In conventional designs, there is a one-to-one relationship between the increase in recombination surface area and the decrease in the frontal (flow-through) area.

It would be advantageous therefore to provide a reactor with a way to dynamically vary the flowfield in different segments of the reactor chamber.

BRIEF SUMMARY OF THE INVENTION

According to one aspect of the present invention, an adjustable orifice plate is provided for placement within a reactor chamber of a reactor system. The orifice plate comprises an upper plate and a lower plate. Each plate is generally planar and is configured to fit around the wafer chuck within the reactor chamber and is further configured to substantially mate with the walls of the reactor chamber. Each plate has a plurality of holes or passages extending through the plate surfaces. The two plates are arranged such that their respective faces are adjacent each other. Furthermore, the plates are independently rotatable about a central axis that is perpendicular to the plate face. The rotation of each plate is independently adjustable from a point exterior the reactor chamber.

According to another aspect of the present invention, the upper and lower orifice plates are automatically adjusted using a programmable controller or computer system that is coupled to drive motors that are further coupled to the upper and lower orifice plates. The programmable controller or computer can be further coupled to pressure sensors within the reactor chamber. A program running on the computer or controller instructs the drive motors to individually rotate upper and lower orifice plates until a desired pressure differential is detected with the pressure sensors.

According to yet another aspect of the present invention, the upper and lower orifice plates are made from a dielectric material and are separated by an intermediate conducting plate disposed between the upper and lower plate. The conducting plate (or honeycomb structure) is configured to allow gas flow therethrough with minimal reduction in flow conduction while maximizing recombination surface area. The conducting plate is preferably fixedly mounted to the wall of the chamber while the upper and lower orifice plates remain rotatable about their respective central perpendicular axis.

According to a further aspect of the present invention a method of tuning a reactor includes the steps of pumping the reactor chamber to a low pressure. The reactor is then operated at the low pressure while pressure readings are taken at two or more pressure sensors within the reactor chamber. While monitoring the pressure sensors, upper and/or lower orifice plates disposed in the reactor chamber are rotated independently of each other. When the desired pressure readings are obtained from the two or more pressure sensors, rotation is halted. At this point, the plates can be fixed in place with retaining pins or the like.

BRIEF DESCRIPTION OF THE SEVERAL VIEWS OF THE DRAWING

The above described and other features of the present invention will be described while referring to the accompanying drawings in which.

DETAILED DESCRIPTION OF THE INVENTION

Figure 1:
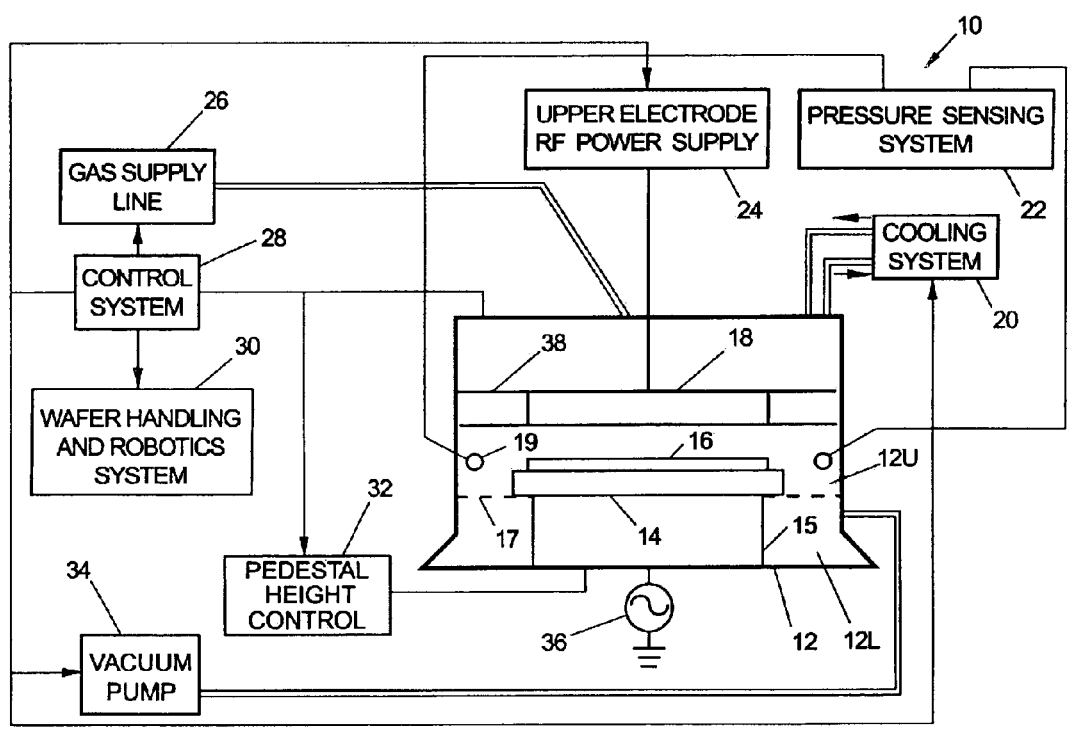
FIG. 1 is a schematic diagram of a narrow gap capacitively coupled plasma reactor.

Referring now to FIG. 1, a preferred embodiment of a narrow gap capacitively coupled plasma reactor 10 is shown to include a reactor chamber 12. Within reactor chamber 12 is housed an upper electrode 18 that is further coupled to a radio frequency (RF) power supply 24. Upper electrode 18 is insulated from the chamber wall by an upper electrode insulator 38. Also housed within reactor chamber 12 is a chuck 14 that supports a workpiece or wafer 16 during processing. Chuck 14 is typically of the variety that provides for vertical translation of wafer 16 in order to close the gap between wafer 16 and upper electrode 18 during processing. Chuck 14 is further coupled to a wafer RF power supply 36 (through a match network) that is used to apply bias to the wafer.

In addition, reactor 10 includes a control system 28 in electronic communication with a wafer handling and robotic system 30. Wafer handling and robotic system 30 operates under control of control system 28 to load a wafer onto chuck 14 and to remove the wafer from reactor chamber 12 when processing is complete. Control system 28 is further connected to a vacuum pump system 34 and a gas supply delivery system 26 that are further coupled to reactor chamber 12. Vacuum pump system 34 and gas supply delivery system 26 work in tandem under control of control system 28 to reduce the pressure in reactor chamber 12 to a desired value and provide a clean environment within chamber 12 that is conducive to the formation of plasmas. Further coupled to reactor chamber 12 is a cooling system 20. Cooling system 20 is also coupled to control system 28 and operates to ensure that the reactor temperature remains within acceptable limits. Reactor system 10 further includes a pedestal height control mechanism 32 that is coupled to pedestal 15, which is further coupled to chuck 14 and control system 28. Pedestal height control mechanism 32 operates under control of control system 28 to adjust the height of chuck 14 within reactor chamber 12.

Additionally, reactor system 10 can include a pressure sensing system 22 that is optionally in electronic communication (not shown) with control system 28. Pressure sensing system 22 is used to sense the pressure at various locations within reactor chamber 12. Pressure sensing system 28 further includes two or more pressure sensors 19 mounted to the wall of reactor chamber 12. Pressure sensors 19 are typically in electronic communication with a display apparatus (not shown). Preferably, a first one of pressure sensors 19 is located near the pump duct entrance, and a second one of pressure sensors 19 is located on the reactor chamber wall diametrically opposite the first pressure sensor.

In accordance with the present invention, reactor system 10 further includes an orifice plate 17 mounted such that is surrounds chuck 14 and seals against the wall of reactor chamber 12. As will be described in more detail below, orifice plate 17 is here dynamically adjustable to change the size of its associated passageways in order to change the flowfield within reactor chamber 12.

Basic operation of reactor 10 occurs according to a parameter set or recipe. Achievement of the predetermined system parameters is controlled by control system 28. When the conditions in reactor chamber 12 reach the desired point, RF power supply 24 is activated and the plasma is ignited. As described above, the operation of RF power supply 24 is also controlled by control system 28. At the end of the process, control system 28 directs the wafer handling and robotic system to remove the wafer 16.

Figure 2:
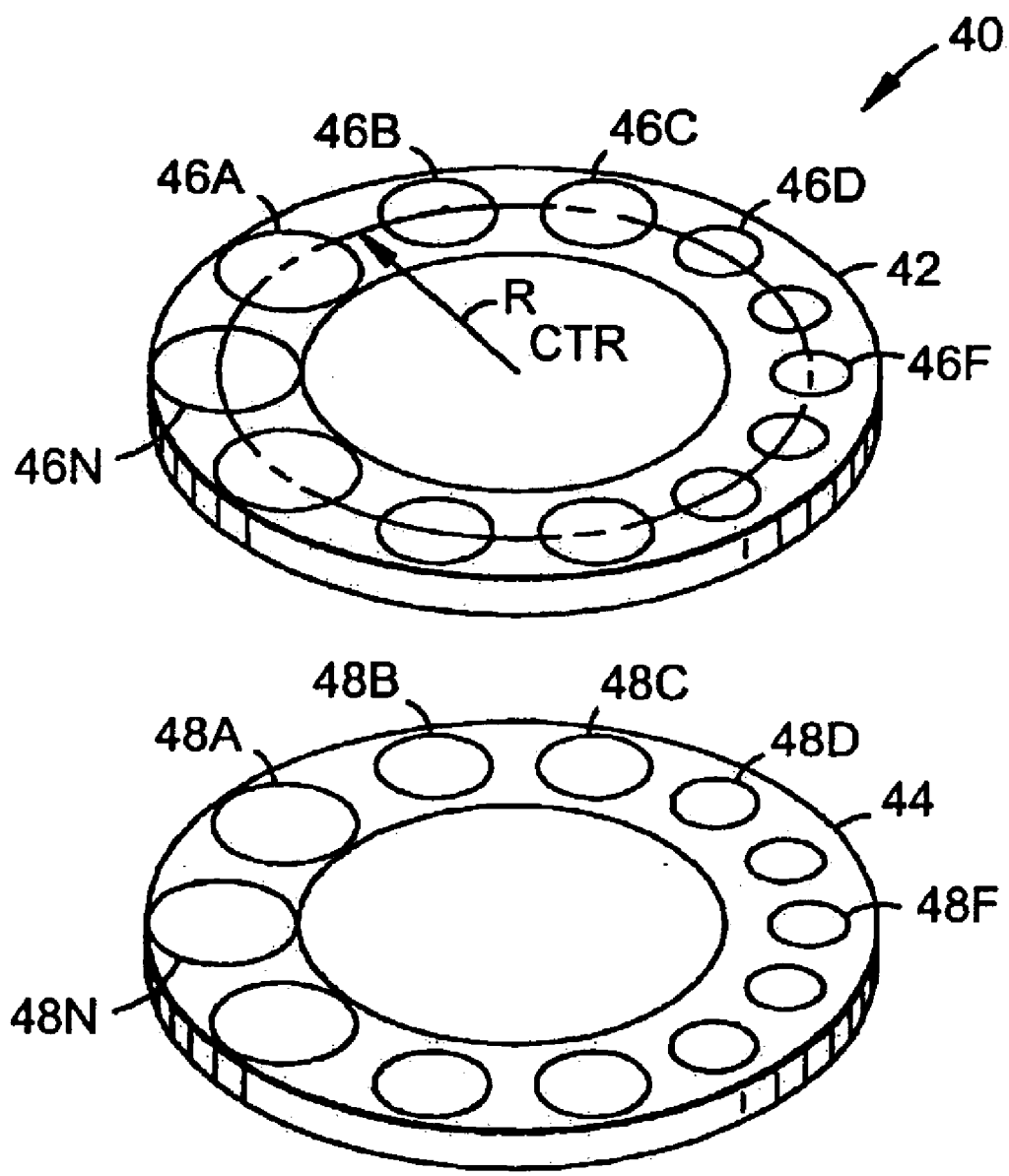
FIG. 2 is an isometric view of a first embodiment of the orifice plate associated with the reactor of FIG. 1.

Referring now to FIG. 2 a first embodiment of orifice plate 40 is shown to include two position-adjustable annular plates, upper plate 42 and lower plate 44. Each plate 42, 44 is generally planar in shape and has a perimeter shape to substantially match the shape of reactor chamber 12. Each plate 42 and 44 further includes multiple through holes 46A–46N and 48A–48N respectively, formed normal to the plane of the plate and distributed azimuthally around the perimeter of the plate. As will be described in more detail below, when upper plate 42 and lower plate 44 are assembled into reactor chamber 12, they are configured to be rotatable with respect to each other as indicated by the arrows in FIG. 2. Upper orifice plate 42 and the lower orifice plate 44 are preferably made of a dielectric material. The respective through holes 46A–46N and 48A–48N are shown as being generally circular in cross section, though other shapes such as rectangles, triangles, etc. are also contemplated by the present invention.

Through holes 46A–46N are configured such that through hole 46A has an associated first radius $R_1$ while through hole 46B has an associated radius $R_2$ which can be different than $R_1$. This arrangement can continue up to and including through hole 46N, which can have a radius $R_1$ that is different than any other radius $R_1$–$R_{n-1}$. In an exemplary embodiment shown in FIG. 2, there are 12 through holes. However, it should be understood that the invention is not so limited and would work with a greater or lesser number of through holes. As shown in FIG. 2 the center point of each of the through holes 46A–46N is on the periphery of a circle or radius that is centered on the principal axis of the annular plate. Through holes 46A–46N are arranged so that, in one configuration, through hole 46N with radius $R_n$, where $R_n$ is the maximum radius, is on one side and the minimum radius through hole 46F with radius R6 is on the opposite side. This same arrangement applies to lower plate 44. It should be noted that if the number of through holes is different than 12, then the through hole with the minimum radius might be other than through hole 46F. Through holes of intermediate sizes are distributed uniformly in both circumferential directions between the largest and the smallest through hole 46N and 46F respectively along the circle of radius $R_{ctr}$. Preferably, the number and design of through holes 46A–46N and 48A–48N are such that the total flow through area is maximized.

As stated above, both upper and lower orifice plates 42 and 44 are designed with the same through hole layout. Therefore, in one configuration, when the "big holes", e.g. through hole 46N with maximum radius $R_1$, of upper plate 42 are aligned with the "big holes" of the lower plate 44, all holes of identical size between the two plates are aligned. This arrangement results in the maximum flow, conductance area through orifice plate 40 occurring at the opposite side (i.e. 180 degrees apart) from the minimum flow conductance area. Conversely, in an alternate configuration, when upper plate and lower plate 42 and 44 are each rotated by 90 degrees in opposite directions relative to one another (or one plate is rotated 180 degrees relative to the other), the flow conductance is more equally distributed in the azimuthal direction. Therefore, use of two orifice plates 42 and 44 whose respective position relative to one another resides between these two extremes can optimally adjust the azimuthal pressure distribution.

In a second embodiment, the respective flow-through area can be varied azimuthally by varying the number density of through holes of equal diameter at a given azimuthal position rather than by varying the through-hole diameter. For example, through holes can be positioned at equal distances along a radial line in the orifice plate at a given azimuthal location. The center of each through hole can be positioned a distance from the center of the orifice plate such that the distance between adjacent through holes along a radial line is constant. Furthermore, this can be repeated for "m" azimuthal positions about the orifice plate such that the azimuthal spacing between adjacent radial lines of through holes is maintained a constant; the through hole number density is thus a constant across the entire orifice plate surface. With this arrangement, removal of through holes (by covering up, etc.) in an increasing sense moving azimuthally to a position 180 degrees relative to the first radial line, such that the latter radial line has fewer through holes than the first radial line, results in the through hole number density decreasing in the azimuthal direction up to 180 degrees around the orifice plate.

The first 42 and second 44 orifice plates can be fabricated with the same through hole pattern such that in one orientation every through hole is aligned and in a second orientation (i.e. plate 42 rotated 180 degrees relative to plate 44) the number of through holes aligned in a given radial line is limited to the plate with the lesser number of through holes at that given radial line. Each plate can be rotated relative to the other in increments of the azimuthal spacing of the radial lines of through holes. With this arrangement, a smooth variation between the conditions when the through hole number density is uniform on the orifice plate and the case where the maximum through hole number density is 180 degrees out of phase from the position of minimum number density can be achieved. Furthermore, the through holes in a given radial line can be clustered (i.e. through hole spacing is a function of the radial location) towards the outer edge of the orifice plate (or similarly towards the inner edge of the orifice plate) to affect a radial variation in the flow conductance. In addition to varying the number density, a combination of the first two embodiments described above, wherein both the through hole size and number density is varied on the orifice plate surface, can be employed.

Figures 7A, 7B, 7C:
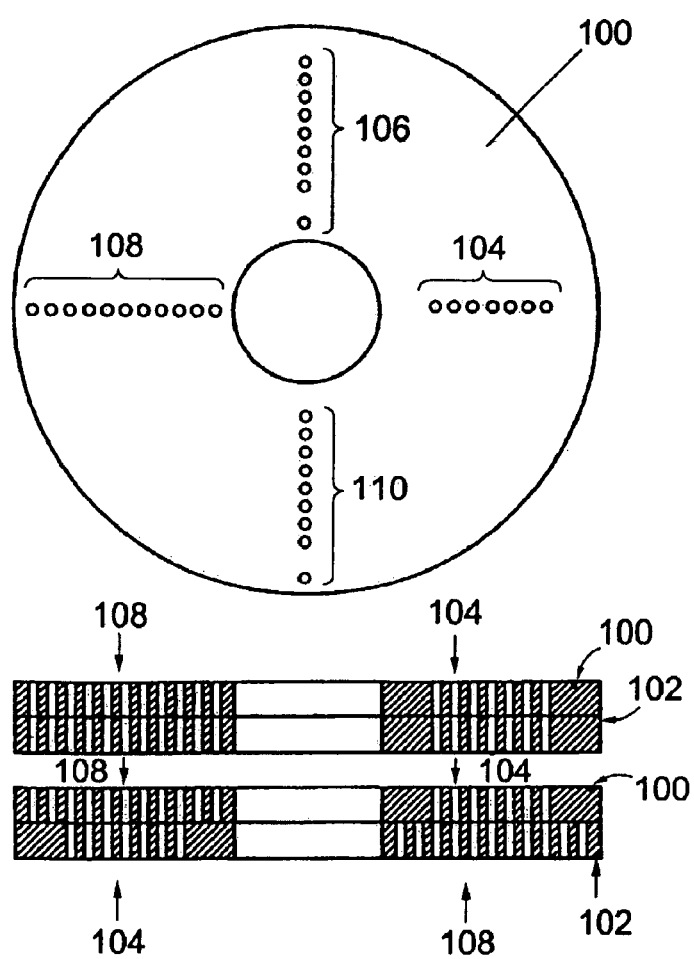
FIG. 7A is a plan view of an exemplary embodiment of the orifice plate associated with the reactor of FIG. 1.
FIGS. 7B and 7C are side cross-sectional views two configurations of the orifice plate of FIG. 7A.

One exemplary embodiment of the plate described above is shown in FIGS. 7A, 7B and 7C and is composed of an upper plate 100 and a lower plate 102 which are identical to one another and are rotatable relative to one another about a common center axis. FIG. 7A is a top plan view of upper plate 100 having four radially extending rows of holes, 104, 106, 108 and 110, the rows being spaced from one another by 90° about the center axis of each plate 100, 102. In the illustrated embodiment, solely by way of example, each plate 100, 102 has seven holes in row 104, nine holes in each of rows 106 and 110 and eleven holes in row 108. In each of rows 104 and 108 the holes are spaced apart equidistantly and each of rows 106 and 110 eight of the holes are spaced apart equidistantly and the ninth hole, at one end of the row, is spaced from the adjacent hole by an amount equal to twice the spacing between the other holes in the row. Therefore, when plates 100 and 102 are juxtaposed, the azimuthal distribution of the flow conductance, or flow-through area can be varied by rotating the plates relative to one another by an interval of n×90°. In FIG. 7B, plates 100 and 102 have identical orientations so that row 104 of plate 100 is aligned with row 104 of plate 102, etc. In this case the number of through holes in orifice plate 100, 102 at successive azimuthal locations is seven, nine, eleven and nine, respectively. In FIG. 7C, plate 102 has been rotated through an angle of 180° relative to plate 100, so that the number of through holes in orifice plate 100, 102 at each azimuthal location is seven. Consequently, in the latter case the flow conductance is equally distributed in the azimuthal direction. More generally, it is preferred that the hole pattern in row 106 not be symmetric with the hole pattern in row 110. Moreover, the minimum set of through-holes (in this case seven) must be located at the same radial locations for each azimuthal location.

The invention described herein presents a method for improving flow field uniformity by azimuthally distributing the flow conductance through orifice plate 40 (FIG. 2) in such a way as to counteract the azimuthal pressure distribution established within the lower chamber volume 12L (FIG. 1) and subsequently the upper chamber volume 12U (FIG. 1). For example, an azimuthally uniform volume flow rate (i.e. pumping speed) at the wafer plane $S_1^n$ and mass flow rate (throughput; mass flow rate is related to the throughput by an equation of state) $Q_1^n = S_1^n P_1^n$ can be achieved when the integrated pressure difference is independent of the azimuthal direction as follows:

$$Q_1^n = \langle C_1(\phi)(P_1^n - P_2(\phi)) \rangle \quad (1)$$

where the brackets indicate the integration, the subscript "1" represents the wafer plane, the subscript "2" represents a plane below the orifice plate, and the superscript "n" denotes the "new" azimuthally uniform quantity as a result of the design. There are two primary approaches to "distributing" the flow conductance azimuthally, namely, azimuthal distribution of the orifice length and azimuthal distribution of the orifice area. In both the continuum flow and free molecular flow limits, the flow conductance is inversely proportional to the orifice length, and directly proportional to the orifice diameter to an exponential power n where n>1 (n=3 in free molecular flow limit and n=4 in continuum flow limit). Preferably, the variation of area is the more desirable design due to its simplicity and its sensitivity for at least two reasons. First, each orifice plate can be machined flat with holes of varying diameter distributed in the azimuthal direction. Second, inspection of the dependence of the flow conductance upon the orifice diameter and length indicates more sensitive spatial control of the flow conductance by adjusting the area. The variation of the orifice area can be constituted as a variation in the spatial number density of equal area holes, a variation of the size of the holes or a combination of both.

Figures 3A, 3B:
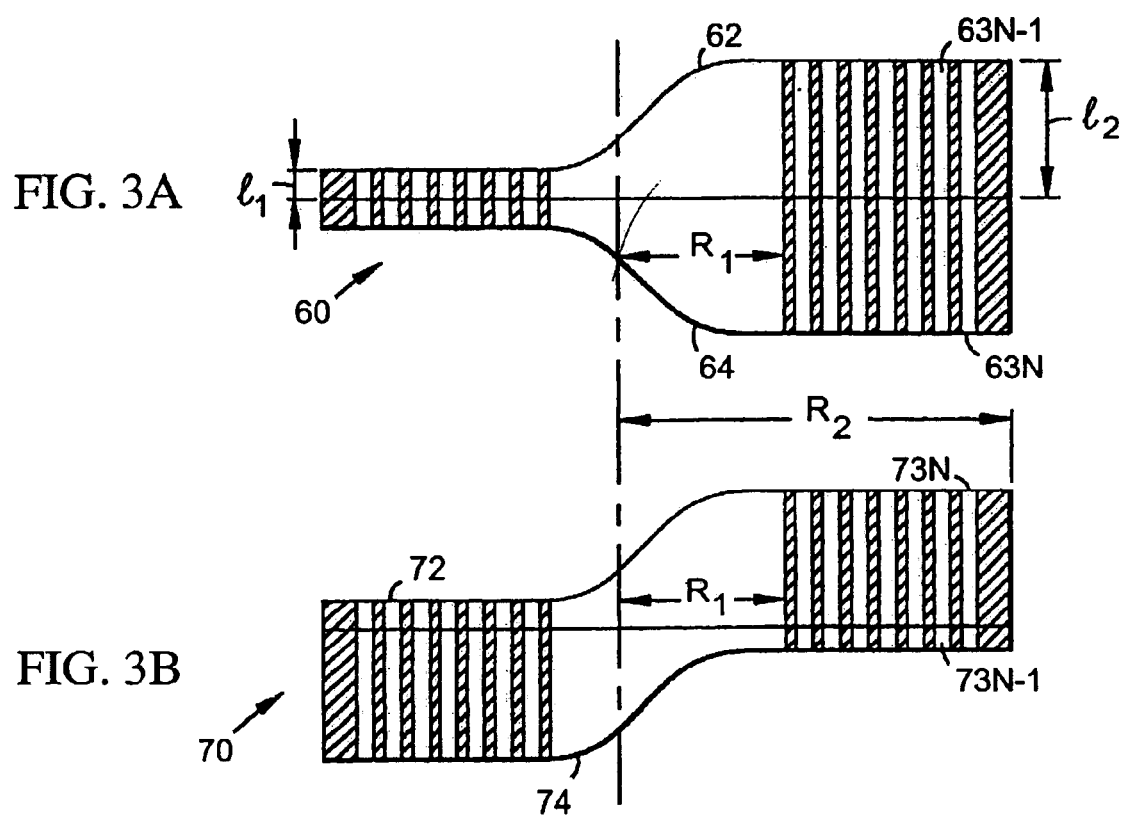
FIGS. 3A and 3B are side cross-sectional views of a second embodiment of the orifice plate associated with the reactor of FIG. 1.

Referring now to FIGS. 3A and 3B, a third embodiment of an orifice plate for azimuthally distributing the flow conductance is shown. In particular, two configurations 60 and 70 of the orifice plate are shown in FIGS. 3A and 3B, respectively. The orifice plate is composed of two rings, numbered 62 and 64 in FIGS. 3A and 72 and 74 in FIG. 3B. Rotation of one ring relative to the other provides the ability to vary the through hole length rather than the through hole cross sectional area as is done with orifice plate 40 (FIG. 2). Each orifice plate configuration 60, 70 is annular with an inner radius $Rr_1$ and an outer radius $R_2$. The inner radius $R_1$ is sufficient to clear the outer radius of chuck 14 while the outer radius $R_2$ is consistent with the outer radius of chamber 12. Each ring has a contoured surface such that the length of an orifice varies azimuthally in the $\phi$ direction. This variation is preferably sinusoidal, but can conform to some other function. Note that at each azimuthal location $\phi$, the contoured surface height does not vary with radius r. Lower ring 64, 74 has the same form as upper ring 62, 72. However, this is not required and the surface contours can differ from one another. However, one ring is inverted relative to the other such that rings 62, 64 may be in direct contact without gaps. This enables direct alignment of holes 63N, etc. By definition, the coordinate $\phi$ represents the azimuthal direction and reference point $\phi=0$ is designated to be substantially at the centerline of the pump duct (not shown). However, $\phi$ may also be arbitrarily defined. Therefore, as shown in configuration 60, the two rings 62, 64 are aligned such that the point of maximum orifice length occurs at exactly $\phi=0$, the reference point. The parameter $\Delta\phi/2$ introduces an azimuthal rotation of the upper ring 62 in consonance with a counter-rotation of the lower ring 64 of $-\Delta\phi/2$. Concurrently rotating and counter-rotating the upper and lower rings 62, 64, respectively, accomplishes a smooth adjustment of the azimuthal distribution of the orifice length. Given the form of the contoured surface shown, the orifice length is defined as $$l(\phi, \Delta\phi) = 2(l_o + \Delta l \cos\phi \cos(\Delta\phi/2)), \quad (2)$$

where $l_o = (l_1 + l_2)/2$ is the average orifice plate thickness and $\Delta l = (l_2 - l_1)/2$ is the sinusoidal amplitude of the surface contour. As stated above, the configuration of orifice plate 60 presents the physical orientation of the two orifice plates 62, 64 when $\Delta\phi = 0$. With this configuration, the maximum conductance occurs at the left side, or $\phi = \pi$, while the minimum conductance occurs at the right side, or $\phi = 0$. Similarly, the configuration of plate 70 presents the physical orientation when the flow conductance is azimuthally constant. This occurs when $\Delta\phi = \pi$ (where the cross-section is shown at 90° relative to configuration 60). It should be noted that the surface contour could take on an arbitrary form.

Figure 4:
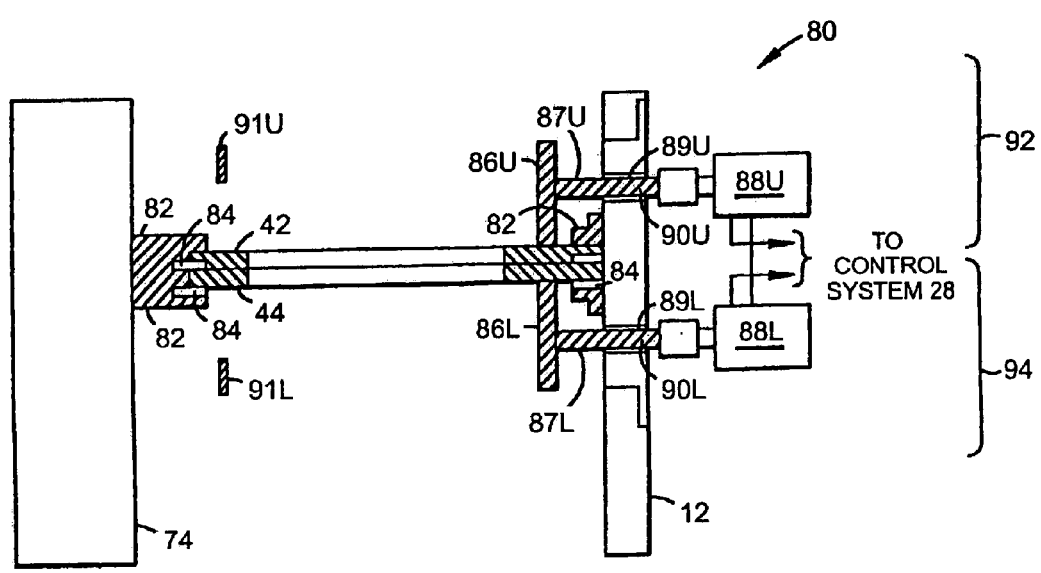
FIG. 4 is a schematic diagram of the orifice plate control assembly for controlling the orifice plate of FIG. 2.

Referring now to FIG. 4, a cross sectional view of an orifice plate assembly 80 is shown. The view in FIG. 4 is taken such that the cross section of a part of orifice plate 40 is shown as it is disposed about chuck 14 and within chamber 12. Here, orifice plate 40 (FIG. 2) is used as a component of the orifice plate assembly 80. Orifice plate assembly 80 includes an upper rotation assembly 92 and a lower rotation assembly 94, both of which are mounted on the wall of reactor chamber 12. Upper rotation assembly 92 is connected to upper orifice plate 42 via an upper quartz (or anodized aluminum) gear 86u. Upper rotation assembly 92 further includes an upper stepper motor 88U that turns an upper quartz drive 90u that passes through an upper Ferrofluidic® bearing 89U. Upper quartz drive 90U is further connected to upper quartz gear 86U. Rotation of upper quartz gear 86U about the longitudinal axis of the upper quartz drive 90U causes the upper orifice plate 42 to rotate about the central axis of chuck 14 (FIG. 1). Rotation of upper orifice plate 42 is here aided by employing cross roller bearings 84 at each insulator 82. Similarly, lower rotation assembly 94 is connected to lower orifice plate 44 via lower quartz gear 86L. Lower rotation assembly 94 further includes a lower stepper motor 88L that turns a lower quartz drive 90L that passes through a lower Ferro-fluidic® bearing 89L. Lower quartz drive 90L is connected to lower quartz gear 86L. Rotation of lower quartz gear 86L about the longitudinal axis of lower quartz drive 90L causes lower orifice plate 44 to rotate about the central axis of the chuck 14 (FIG. 1). Preferably upper and lower rotation assemblies 92, 94 are coupled to and controlled by control system 28 (FIG. 1). An additional material other than quartz that can be used for fabrication of the upper and lower rotation assemblies can be anodized aluminum.

Three alternate methods of tuning reactor 10 (FIG. 1) will now be discussed while referring back to FIGS. 1–4. The first method includes the following process steps taken in order. First, reactor 10 is operated at a low pressure, namely, 1 mTorr to 10 Torr. Then, while operating the processing reactor at low pressure, the chamber pressure is detected at two or more locations within chamber 12. These two or more locations correspond to the location of pressure sensors 19. Preferably, a first one of sensors 19 is located at the pumping duct entrance and a second one of sensors 19 is located on the interior of the chamber wall diametrically opposite the first sensor. Then, orifice plates 42 and 44 are manually adjusted until a uniform pressure field, i.e. equal pressure readings from pressure sensors 19, is achieved. Next, the chamber pressure is raised to atmospheric pressure and reactor chamber 12 is opened. Upper and lower rotation assemblies 92 and 94 are then removed from reactor chamber 12. The holes left by removal of upper and lower quartz drives 90U and 90L are then plugged. Lastly, upper and lower orifice plates may be fixed in place using respective quartz pins 91U and 91L, although only a single pin, preferably upper pin 91U, may be required. The, or each, pin can have a slight taper, i.e., the pin diameter decreases from top to bottom, and may be inserted first into upper plate 42 and friction fit, or it can be a cylindrical pin fitted into a cylindrical hole in each plate, the pin having a head permitting easy insertion and removal. Moreover, the use of a pin, or pins, is optional. It is not a necessary requirement, unless the plates are subject to movement due to mechanical vibrations or operator interference.

An alternate method of tuning the processing reactor includes the following steps. First, reactor 10 is operated at a low pressure as above. Then, while operating reactor at the low pressure, the chamber pressure is detected at two or more locations within chamber 12 as above. Here then, the pressure readings are communicated to control system 28. Next, orifice plates 42 and 44 are manually adjusted until a uniform pressure field as above.

A third alternative for tuning reactor 10 involves automatic operation of upper and lower rotation assemblies 92 and 94 by control system 28. Control system 28 operates under program control to pump down reactor chamber 12 until it reaches the proper operating pressure. Then pressure readings are taken by pressure sensing system 22 (including pressure sensors 19) in response to requests for pressure data by control system 28. In response to the pressure data received, control system 28 will operate upper and lower rotation assemblies 92 and 94 while continuously requesting pressure data from pressure sensing system 22. When the pressure differential as read by pressure sensing system 22 from pressure sensors 19 reaches an acceptable limit, control system 28 then stops rotating upper and lower orifice plates 42 and 44. The locations of upper and lower orifice plates 42 and 44 are then stored by control system 28 (as encoder feedback data from stepper motors 88U and 88L). According to the invention, a standard optimization scheme is used as the basis of a program that is executed by control system 28 in order to send signals to both motors 88U and 88L to adjust respective orifice plates 42 and 44 relative to each other in order to minimize the difference in pressure between the two (or more) sensor readings. For example, if the pressure is highest at the sensor located opposite (or furthest) from the pump and the pressure is lowest at the sensor(s) closest to the pump, then the orifice plates are rotated such that the distribution of through hole area is greatest (or flow conductance is greater) where the pressure was recorded highest, while the through hole area is minimized in the areas near where the pressure was recorded lowest.

Figure 5:
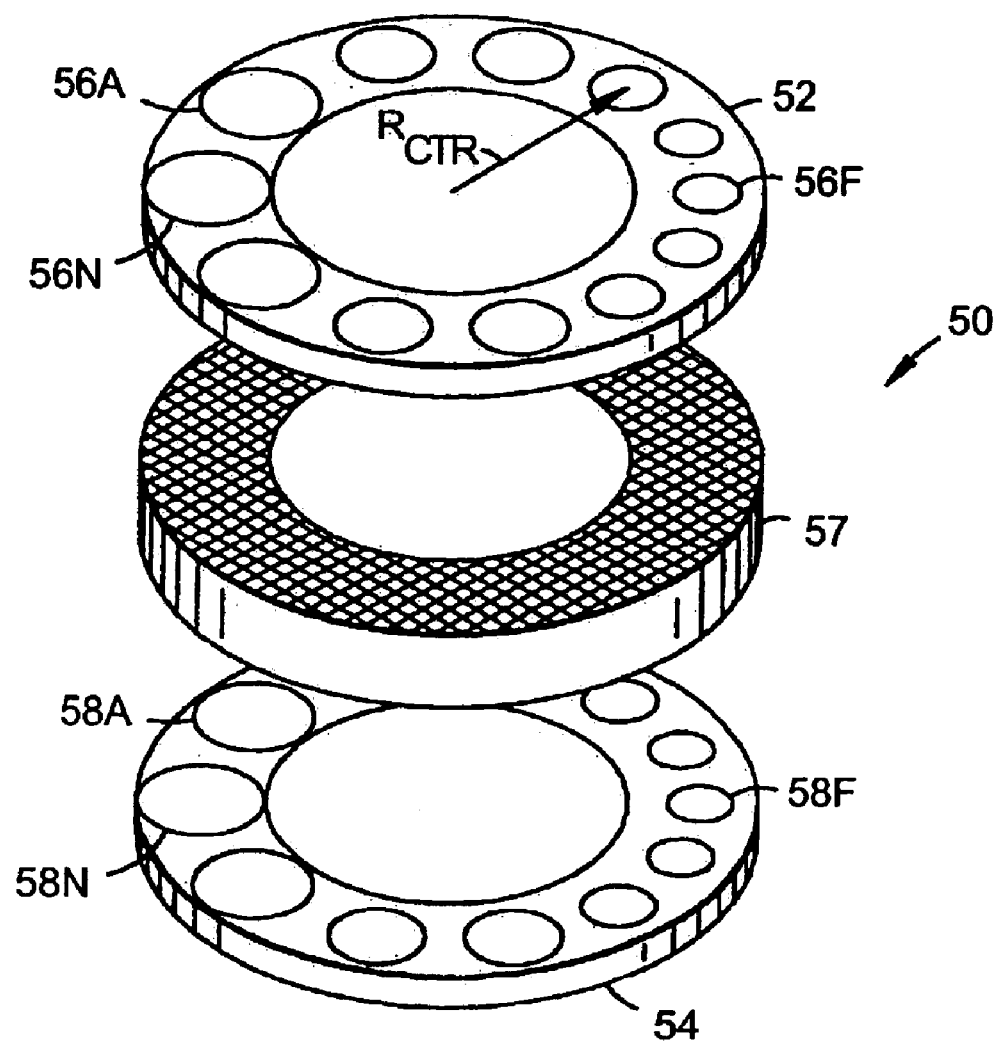
FIG. 5 is an isometric view of a third embodiment of the orifice plate associated with the reactor of FIG. 1.

Referring now to FIG. 5, a third embodiment of the adjustable orifice plate 50 is shown to include two position-adjustable annular plates, upper plate 52 and lower plate 54. Each plate 52, 54 is generally planar in shape and will have a perimeter shape configured to substantially match the shape of inner reactor chamber 12 (FIG. 1). Each plate 52 and 54 further includes multiple through holes 56A–56N and 58A–58N respectively, formed normal to the plane of the plate and distributed azimuthally around the perimeter of the plate. As will be described in more detail below, when upper plate 52 and lower plate 54 are assembled into reactor chamber 12, they are configured to be rotatable with respect to each other as indicated by the arrows in FIG. 5. Upper orifice plate 52 and the lower orifice plate 54 are preferably made of a dielectric material. The respective through holes 56A–56N and 58A–58N are shown as being generally circular in cross section, though other shapes such as rectangles, triangles, etc. would also work.

Through holes 56A–56N are configured such that through hole 56A has an associated first radius $R_1$ while through hole 56B has an associated radius $R_2$ which may be different than $R_1$. This arrangement can continue up to and including through hole 56N, which may have a radius $R_n$ that is different than any other radius $R_1$ through $R_{n-1}$. In an exemplary embodiment shown in FIG. 5, there are 14 through holes for each plate 52, 54. However, it should be understood that the invention is not so limited and would work with a greater or lesser number of holes. As shown in FIG. 5 the center point of each of the through holes 46A–46N is on the periphery of a circle or radius that is centered on the principal axis of the annular plate. Through holes 56A–56N are arranged so that, in one configuration, through hole 56N with radius $R_n$, where $R_n$ is the maximum radius, is on one side and the minimum radius through hole 46f with radius R6 is on the diametrically opposite side. This same arrangement applies to lower plate 54. It should be noted that if the number of through holes is different than 14, then the through hole with the minimum radius might be other than through hole 56F. Through holes of intermediate sizes are distributed uniformly between the largest and the smallest through hole 56N and 56F respectively along the circle of radius $R_{ctr}$. Like orifice plate 40 of FIG. 2, preferably, the number and design of through holes 56A–56N and 58A–58N is such that the total flow through area is maximized.

As stated above, both upper and lower orifice plates 52 and 54 are designed with the same through hole layout. Therefore, in one configuration, when the "big holes", e.g. through hole 56N with maximum radius $R_n$, of upper plate 52 are aligned with the "big holes" of the lower plate 54, all holes of identical size between the two plates are aligned. This arrangement results in the maximum flow conductance through orifice plate 50 occurring at the opposite side (i.e. 180 degrees apart) from the minimum flow conductance area. Conversely, in an alternate configuration, when upper plate and lower plate 52 and 54 are each rotated by 90 degrees in opposite directions relative to one another (or one plate is rotated 180 degrees relative to the other), the flow conductance is more equally distributed in the azimuthal direction. Therefore, use of two orifice plates 52 and 54 whose respective positions relative to one another reside between these two extremes can optimally adjust the azimuthal pressure distribution.

In accordance with another aspect of the present invention, orifice plate 50 is further configured with honeycomb orifice plate 57 disposed between upper rotatable orifice 52 plate and the lower rotatable orifice plate 54. Honeycomb plate 57 is fixed relative to upper and lower orifice plates 52, 54 and is preferably made of a conductive material such as aluminum. Honeycomb plate 57 is further designed to maximize the flow conductance through the orifice plate 50, while at the same time providing an electrically grounded surface with a large surface area to facilitate ion-electron recombination. A preferred method of fabricating fixed honeycomb orifice plate 57 includes assembling and welding together corrugated pieces of aluminum; baking the welded structure to allow it to outgas; and anodizing the structure to prevent the generation of undesired sputtered materials during use in reactor chamber 12 (FIG. 1).

Although FIG. 5 illustrates the use of honeycomb orifice plate 57 with an apparatus for adjusting the azimuthal pressure distribution, honeycomb orifice plate 57 (or a device of substantially similar construction) could also be used alone as a means of introducing an increase in the recombination surface area (wetted area) while maintaining sufficiently high flow conductance. For example, if the honeycomb orifice plate 57 had 50% solidity (i.e. the ratio of the flow through area to the total frontal area is 50%) and was employed as a pump shield inserted into the pumping duct (or across the annular region surrounding the chuck) (not shown) in order to attenuate the plasma density via recombination, then a reduction in the flow conductance would occur. This reduction would be on the order of a factor of two while an increase in the wetted surface area of $\pi D^2/8$ would result (where D is the effective diameter of the pumping duct or flow-through area without the pump shield). Furthermore, if a honeycomb orifice plate 57 with a thickness L and a hole diameter D*, such that $D^* \geq L$, was inserted into the pumping duct, the maximum reduction in the flow conductance (under this assumption) will be a factor of two while the increase in the wetted surface area would become $\pi D^2$. Thus, the use of a honeycomb orifice plate in the pumping duct provides a factor of eight increase in the recombination surface area with the same reduction in the total flow conductance.

In alternate embodiments, the honeycomb orifice plate 57, when fabricated of a conducting material, can be electrically floating, electrically grounded or electrically biased. When electrically biased, the honeycomb orifice plate can be dc-biased or RF-biased depending upon the application; however, RF-biased is preferred.

Figure 6:
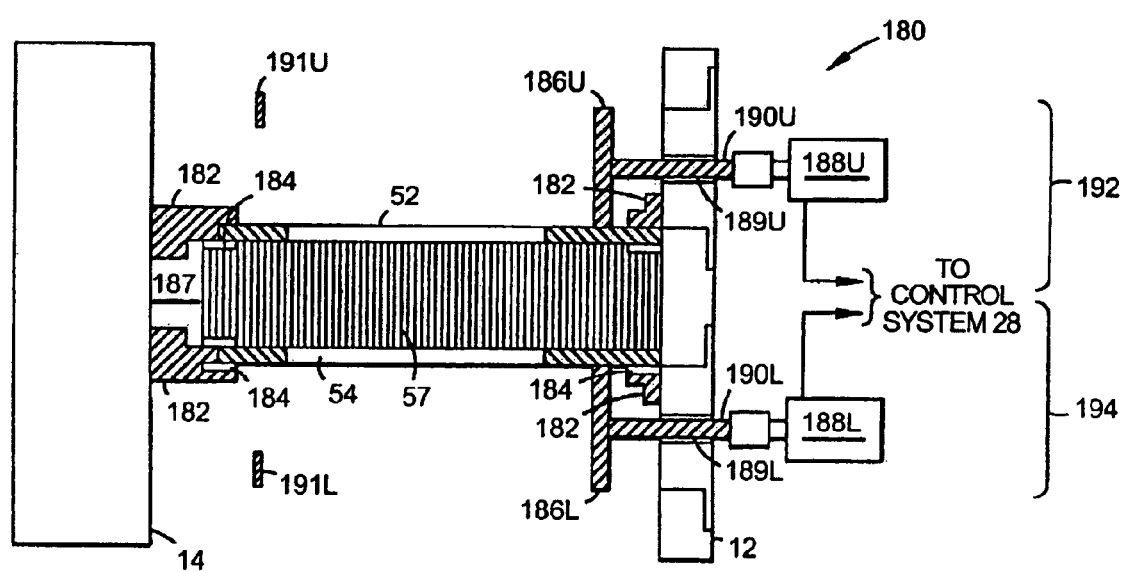
FIG. 6 is a schematic diagram of the orifice plate control assembly for controlling the orifice plate of FIG. 5.

Referring now to FIG. 6, a cross sectional view of an orifice plate assembly 180 is shown. Here, orifice plate 50 (FIG. 5) is used as an orifice plate for assembly 180. Orifice plate assembly 180 includes an upper rotation assembly 192 and a lower rotation assembly 194, both of which are mounted on the wall of reactor chamber 12. Upper rotation assembly 192 is connected to upper orifice plate 52 via an upper quartz or anodized aluminum gear 186U. The upper rotation assembly further includes an upper stepper motor 188U that turns an upper quartz or anodized aluminum drive 190u that passes through an upper Ferro-fluidic® bearing 189U. Upper drive 190U is further connected to upper quartz or anodized aluminum gear 186U. Rotation of upper gear 186U about the longitudinal axis of the upper drive 190U causes the upper orifice plate 52 to rotate about the central axis of chuck 14 (FIG. 1). Orifice plate assembly 180 further includes a conductor-mounting piece 187 that is connected to the chuck 14 (FIG. 1) and to which the dielectric coated conducting honeycomb plate 57 is secured.

In general, for the purpose of increasing surface recombination area, honeycomb structure 57 could be fabricated entirely from a dielectric material or it may be fabricated from, e.g., aluminum to provide structural rigidity, and may be coated with a dielectric material, for example quartz. The honeycomb then serves the purpose of providing additional surface recombination area while restricting the flow of ions and electrons to the surface to be such that the respective ion and electron currents are equal. Moreover, the aluminum honeycomb can be grounded since it will be connected to the outside chamber wall, which is the chamber ground. In a second embodiment, the honeycomb structure can be a purely conducting structure which is grounded. Therein, the inclusion of the honeycomb structure acts to increase the grounded surface area in contact with the plasma and, hence, affect the plasma potential. In fact, it is expected that an increase in the grounded surface area would lead to a decrease in the plasma potential. If the grounded, conducting honeycomb structure 57 is utilized in conjunction with the dielectric orifice plate, in particular the upper plate, then the azimuthal distribution of the grounded surface area may be adjusted to affect changes in the azimuthal distribution of the plasma potential that may arise due to chamber non-uniformities such as the chamber vacuum pumping duct or the chamber wafer feed-through duct.

Rotation of upper orifice plate 52 is here aided by employing cross roller bearings 184 at conductor-mounting piece 187. Similarly, lower rotation assembly 194 is connected to lower orifice plate 54 via lower quartz or anodized aluminum gear 186L. Lower rotation assembly 194 further includes a lower stepper motor 188L that turns a lower quartz or anodized aluminum drive 190L that passes through a lower Ferro-fluidic® bearing 189L. Lower drive 190L is connected to lower gear 186L. Rotation of lower gear 186L about the longitudinal axis of lower drive 190L causes lower orifice plate 54 to rotate about the central axis of chuck 14 (FIG. 1). Rotation of lower orifice plate 54 is here aided by employing cross roller bearings at each insulator 182. Other configurations and location of bearings can also be employed. Preferably upper and lower rotation assemblies 192, 194 are coupled to and controlled by control system 28 (FIG. 1). Also included are a first quartz pin 191U for securing the upper orifice plate in place if desired, and a second quartz pin 191L for securing the lower orifice plate in place if desired.

The method for tuning a discharge reactor system employing the orifice plate assembly 180 of FIG. 6 would be substantially the same as described above in connection with orifice plate assembly 80 (FIG. 4).

The many features and advantages of the present invention are apparent from the detailed specification and thus, it is intended by the appended claims to cover all such features and advantages of the described apparatus which follow the true spirit and scope of the invention. Furthermore, since numerous modifications and changes will readily occur to those of skill in the art, it is not desired to limit the invention to the exact construction and operation described herein. Moreover, the process and apparatus of the present invention, like related apparatus and processes used in the semiconductor arts tend to be complex in nature and are often best practiced by empirically determining the appropriate values of the operating parameters or by conducting computer simulations to arrive at a best design for a given application. Accordingly, all suitable modifications and equivalents should be considered as falling within the spirit and scope of the invention.

What is claimed is:

1. An orifice plate assembly for use in a reactor comprising:
    an upper plate having opposed first and second faces and having a plurality of passages extending between said upper plate first and second faces;
    a lower plate having opposed first and second substantially parallel faces and having a plurality of passages extending between said lower plate first and second faces; and
    wherein said upper plate and said lower plate are arranged such that said first face of said upper plate faces said second face of said lower plate and at least some of said passages in said upper plate align with said passages in said lower plate to create through-passages, wherein said upper plate and lower plate are rotatable with respect to each other about an axis generally parallel to said passages so that size of said through-passages is selectively changed to affect flow conductance through the orifice plate assembly.

2. The orifice plate assembly of claim 1 wherein said upper and lower plates are configured to moveably mate with an inner wall of the reactor.

3. The orifice plate assembly of claim 1 further comprising at least one locking mechanism for locking at least one of said plates in a fixed position.

4. The orifice plate assembly of claim 1 wherein each said plate has a generally planar shape and said first and second faces of each said plate are substantially parallel to one another.

5. The orifice plate assembly of claim 1 further comprising:
    an intermediate plate disposed between said upper plate and said lower plate and having a generally planar shape with associated first and second faces, said intermediate plate being configured to allow fluid to pass therethrough;
    wherein said upper plate and said lower plate are arranged such that said first face of said upper plate is adjacent said first face of said intermediate plate and said second face of said lower plate is adjacent said second face of said intermediate plate.

6. The orifice plate assembly of claim 5 wherein said upper plate, lower plate and intermediate plate are configured to fit about a chuck assembly within the reactor.

7. The orifice plate assembly of claim 5 wherein said upper plate and said lower plate are made from a dielectric or conducting material and said intermediate plate is made from a conducting material.

8. The orifice plate assembly of claim 5 wherein said upper and lower plates are configured to moveably mate with an inner wall of the reactor.

9. The orifice plate assembly of claim 5 further comprising:
    a first drive motor coupled to said upper plate; and
    a second drive motor coupled to said lower plate.

10. The orifice plate assembly of claim 5 further comprising at least one locking mechanism for locking at least one of said upper and lower plates in a fixed position.

11. The orifice plate assembly of claim 5 wherein said intermediate plate is configured with a generally honeycomb shape between said first face of said intermediate plate and said second face of said intermediate plate.

12. The orifice plate assembly of claim 5 wherein each of said upper and lower plates has a generally planar shape and said first and second faces of each said plate are substantially parallel to one another.

13. A reactor comprising:
    a vacuum chamber;
    a chuck within said vacuum chamber for holding a wafer;
    a pump coupled to said vacuum chamber and operable to create a vacuum within said vacuum chamber; and
    an orifice plate assembly as defined in claim 5 disposed about and adjacent said chuck assembly.

14. The orifice plate assembly of claim 1, further comprising a drive motor coupled to at least one of said upper plate and said lower plate, wherein said drive motor is operable to cause rotation of said respective plate.

15. The orifice plate assembly of claim 1, in combination with a reactor comprising:
    a vacuum chamber;
    a chuck disposed within said vacuum chamber configured to support a wafer;
    a pump in communication with said vacuum chamber and operable to create a vacuum within said vacuum chamber,
    wherein the orifice plate assembly is disposed within said vacuum chamber and is adjustable to achieve a uniform pressure field within said vacuum chamber.

16. The orifice plate assembly of claim 15, further comprising:
    a control system coupled to said drive motor; and
    a plurality of pressure sensors disposed within said vacuum chamber,
    wherein said control system is operable to actuate said drive motor in response to signals received from said pressure sensors.

17. The orifice plate assembly of claim 1, wherein the passages in at least one of said upper plate and said lower plate have different radii.

18. The orifice plate assembly of claim 1, wherein the passages in at least one of said upper plate and said lower plate have different lengths between the first and second faces.

19. The orifice plate assembly of claim 1, wherein the passages in at least one of said upper plate and said lower plate are arranged in groups of different numbers of passages.

20. An orifice plate assembly for use in a reactor comprising:
    an upper plate having opposed first and second faces and having a plurality of passages extending between said upper plate first and second faces;
    a lower plate having opposed first and second substantially parallel faces and having a plurality of passages extending between said lower plate first and second faces; and
    wherein said upper plate and said lower plate are arranged such that said first face of said upper plate faces said second face of said lower plate and wherein said upper plate and lower plate are individually rotatable about an axis generally parallel to said passages, wherein said upper and lower plates are made of a dielectric material and are configured to fit about a chuck assembly within the reactor.

21. The orifice plate assembly of claim 20, further comprising:
an intermediate plate disposed between said upper plate and said lower plate and having a generally planar shape with associated first and second faces, said intermediate plate being configured to allow fluid to pass therethrough;
wherein said upper plate and said lower plate are arranged such that said first face of said upper plate is adjacent said first face of said intermediate plate and said second face of said lower plate is adjacent said second face of said intermediate plate.

22. The orifice plate assembly of claim 21 wherein said upper plate and said lower plate are made from a dielectric or conducting material and said intermediate plate is made from a conducting material.

23. The orifice plate assembly of claim 21 wherein said upper and lower plates are configured to moveably mate with an inner wall of the reactor.

24. The orifice plate assembly of claim 21 further comprising:
a first drive motor coupled to said upper plate; and
a second drive motor coupled to said lower plate.

25. The orifice plate assembly of claim 21 further comprising at least one locking mechanism for locking at least one of said upper and lower plates in a fixed position.

26. The orifice plate assembly of claim 21 wherein said intermediate plate is configured with a generally honeycomb shape between said first face of said intermediate plate and said second face of said intermediate plate.

27. The orifice plate assembly of claim 21 wherein each of said upper and lower plates has a generally planar shape and said first and second faces of each said plate are substantially parallel to one another.

28. The orifice plate assembly of claim 20, wherein the passages in at least one of said upper plate and said lower plate have different radii.

29. The orifice plate assembly of claim 20, wherein the passages in at least one of said upper plate and said lower plate have different lengths between the first and second faces.

30. The orifice plate assembly of claim 20, wherein the passages in at least one of said upper plate and said lower plate are arranged in groups of different numbers of passages.

31. An orifice plate assembly for use in a reactor comprising:
an upper plate having opposed first and second faces and having a plurality of passages extending between said upper plate first and second faces;
a lower plate having opposed first and second substantially parallel faces and having a plurality of passages extending between said lower plate first and second faces; and
wherein said upper plate and said lower plate are arranged such that said first face of said upper plate faces said second face of said lower plate and wherein said upper plate and lower plate are individually rotatable about an axis generally parallel to said passages, further comprising:
a first drive motor coupled to said upper plate; and
a second drive motor coupled to said lower plate.

32. The orifice plate assembly of claim 31, wherein the passages in at least one of said upper plate and said lower plate have different radii.

33. The orifice plate assembly of claim 31, wherein the passages in at least one of said upper plate and said lower plate have different lengths between the first and second faces.

34. The orifice plate assembly of claim 31, wherein the passages in at least one of said upper plate and said lower plate are arranged in groups of different numbers of passages.

35. A reactor comprising:
a vacuum chamber;
a chuck within said vacuum chamber for holding a wafer;
a pump coupled to said vacuum chamber and operable to create a vacuum within said vacuum chamber; and
an orifice plate assembly including
an upper plate having opposed first and second faces and having a plurality of passages extending between said upper plate first and second faces, and
a lower plate having opposed first and second substantially parallel faces and having a plurality of passages extending between said lower plate first and second faces,
wherein said upper plate and said lower plate are arranged such that said first face of said upper plate faces said second face of said lower plate,
wherein said upper plate and lower plate are individually rotatable about an axis generally parallel to said passages, and
wherein said orifice plate assembly is disposed about and adjacent said chuck.

36. The reactor of claim 35 wherein said upper and lower plates are configured to moveably mate with an inner wall of said vacuum chamber.

37. The reactor of claim 35 further comprising:
a first drive motor coupled to said upper plate; and
a second drive motor coupled to said lower plate, each of said first and second drive motors being operable to cause rotation of said upper plate and lower plate respectively.

38. The reactor of claim 37 further comprising:
a control system coupled to said first and second drive motors; and
a plurality of pressure sensors disposed within said vacuum chamber; and
wherein said control system is operable to actuate said first and second drive motors in response to signals received from said pressure sensors.

39. The reactor of claim 35 further comprising at least one locking mechanism for locking at least one of said plates in a fixed position.

40. The orifice plate assembly of claim 35 further comprising:
an intermediate plate disposed between said upper plate and said lower plate and having a generally planar shape with associated first and second faces, said intermediate plate being configured to allow fluid to pass therethrough;
wherein said upper plate and said lower plate are arranged such that said first face of said upper plate is adjacent said first face of said intermediate plate and said second face of said lower plate is adjacent said second face of said intermediate plate.

41. The orifice plate assembly of claim 35, wherein the passages in at least one of said upper plate and said lower plate have different radii.

42. The orifice plate assembly of claim 35, wherein the passages in at least one of said upper plate and said lower plate have different lengths between the first and second faces.

43. The orifice plate assembly of claim 35, wherein the passages in at least one of said upper plate and said lower plate are arranged in groups of different numbers of passages.

44. A method of tuning a plasma discharge reactor comprising the steps of:
fitting a vacuum chamber of said reactor with an adjustable orifice plate having an adjustable flow conductance;
fitting said vacuum chamber with a plurality of pressure sensors;
pumping said vacuum chamber to a low pressure;
monitoring readings from said plurality of pressure sensors;
adjusting the flow conductance of said adjustable orifice plate until a desired reading is obtained from said pressure sensors; and
fixing said orifice plate in a position corresponding to a position at which said desired pressure reading was obtained.

45. The method of claim 44 further comprising:
coupling a control system to said plasma discharge reactor;
coupling said adjustable orifice plate and said pressure sensors to said control system;
programming said control system to operate said adjustable orifice plate in response to said monitoring step; and
operating said control system to adjust said adjustable orifice plate until said desired reading is obtained.

46. An orifice plate assembly for use in a plasma reactor comprising:
an upper plate having a generally planar shape with associated first and second substantially parallel faces and having a plurality of passages extending between said upper plate first and second faces;
a lower plate having a generally planar shape with associated first and second substantially parallel faces and having a plurality of passages extending between said lower plate first and second faces; and
an intermediate plate disposed between said upper plate and said lower plate and having a generally planar shape with associated first and second faces, said intermediate plate configured to allow fluid to pass therethrough,
wherein said upper plate and said lower plate are selectively rotatable with respect to each other in response to a signal representative of sensed pressure in a vicinity of said orifice plate assembly.

47. An orifice plate assembly for use in a plasma reactor comprising:
an upper plate having a generally planar shape with associated first and second substantially parallel faces and having a plurality of passages extending between said upper plate first and second faces;
a lower plate having a generally planar shape with associated first and second substantially parallel faces and having a plurality of passages extending between said lower plate first and second faces; and
an intermediate plate disposed between said upper plate and said lower plate and having a generally planar shape with associated first and second faces, said intermediate plate configured to allow fluid to pass therethrough, wherein said upper and lower plates are made of a dielectric or conducting material and said intermediate plate is made of an electrically conducting material.

* * * * *